US012757686B2

(12) United States Patent
Raghavan et al.

(10) Patent No.: US 12,757,686 B2
(45) Date of Patent: Oct. 6, 2026

(54) SUBSTRATE HANDLING APPARATUS FOR EXTREME WARPED WAFERS

(71) Applicant: KLA-Tencor Corporation, Milpitas, CA (US)

(72) Inventors: Balajee Raghavan, Simei (SG); Andrey Yakovlev, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/148,498

(22) Filed: Oct. 1, 2018

(65) Prior Publication Data

US 2019/0131161 A1 May 2, 2019

Related U.S. Application Data

(60) Provisional application No. 62/578,251, filed on Oct. 27, 2017.

(51) Int. Cl.

| | |
|---|---|
| ***H10P 72/78*** | (2026.01) |
| ***B25B 11/00*** | (2006.01) |
| ***H10P 72/00*** | (2026.01) |
| ***H10P 72/76*** | (2026.01) |

(52) U.S. Cl.

CPC ............ *H10P 72/78* (2026.01); *B25B 11/005* (2013.01); *H10P 72/0616* (2026.01); *H10P 72/7602* (2026.01); *H10P 72/7624* (2026.01)

(58) Field of Classification Search

USPC .......................................................... 118/719

See application file for complete search history.

(56) References Cited

U.S. PATENT DOCUMENTS 9,202,738 B2 12/2015 Greenberg et al.
9,960,070 B2 5/2018 Huang
9,991,152 B2 6/2018 Ingram-Goble et al.
(Continued)

FOREIGN PATENT DOCUMENTS

CN 105556654 A 5/2016
CN 105009271 A 9/2017
(Continued)

OTHER PUBLICATIONS

International Search Report mailed Mar. 11, 2019 for PCT/US2018/057618.

(Continued)

*Primary Examiner* — Ram N Kackar
(74) *Attorney, Agent, or Firm* — Suiter Swantz IP

(57) ABSTRACT

A substrate handling apparatus is provided. The substrate handling apparatus may include a forked structure with one or more support portions which are arranged to provide access to a back surface of a substrate. The substrate handling apparatus may also include a first active support element and a second active support element configured to couple the substrate handling apparatus to the back surface of the substrate. After being placed on the first active support element and the second active support element, the substrate may tilt or lean to create at least a third, passive point of contact along the forked structure. The creation of at least a third, passive point of contact may increase substrate handling and control capabilities with warped substrates.

20 Claims, 5 Drawing Sheets

(56) References Cited

U.S. PATENT DOCUMENTS

| | | | | |
|---|---|---|---|---|
| 2014/0265392 | A1* | 9/2014 | Pergande | H01L 21/68707 294/81.5 |
| 2015/0076849 | A1 | 3/2015 | Jin et al. | |
| 2015/0086316 | A1* | 3/2015 | Greenberg | B25J 15/0052 414/752.1 |
| 2015/0246447 | A1* | 9/2015 | Furuichi | B25J 15/0616 294/188 |
| 2015/0255322 | A1* | 9/2015 | Ingram-Goble | H01L 21/67778 414/744.2 |
| 2015/0287626 | A1 | 10/2015 | Arai | |
| 2015/0332950 | A1 | 11/2015 | Mazzocco et al. | |
| 2017/0133260 | A1* | 5/2017 | Pohl | H01L 21/68742 |

FOREIGN PATENT DOCUMENTS

| | | | | |
|---|---|---|---|---|
| CN | 105556654 | B | 7/2019 | |
| DE | 112015000181 | | 7/2016 | |
| JP | 2016538711 | A | 12/2016 | |
| JP | 2016533636 | | 11/2017 | |
| JP | 6362681 | B2 | 7/2018 | |
| JP | 2018157221 | A | 10/2018 | |
| JP | 6595663 | B2 | 10/2019 | |
| KR | 20060108086 | A | 10/2006 | |
| KR | 10-2008-0068319 | * | 7/2008 | H01L 21/67742 |
| KR | 20160062095 | A | 6/2016 | |
| TW | 200403540 | A | 3/2004 | |
| TW | 200405425 | A | 4/2004 | |
| TW | 200723397 | A | 6/2007 | |
| TW | 201415576 | A | 4/2014 | |
| TW | 201515977 | A | 5/2015 | |
| TW | 201546947 | A | 12/2015 | |
| TW | I611997 | B | 1/2018 | |
| TW | I628736 | B | 7/2018 | |
| TW | 201923937 | A | 6/2019 | |
| WO | 2015048303 | A1 | 4/2015 | |
| WO | 2015134258 | A1 | 9/2015 | |

OTHER PUBLICATIONS

Office Action in Taiwanese Application No. 107136645 dated Apr. 12, 2022, 17 pages (with Translation).

Office Action in Japanese Application No. 2020-523381 dated Sep. 7, 2022, 10 pages (with Translation).

Chinese Patent Office, Office Action dated Mar. 31, 2023, received in Chinese Application No. 201880072282.2, 14 pages (including translation).

Korean Patent Office, Office Action dated Feb. 16, 2023, received in Korean Application No. 10-2020-7015079, 18 pages (including translation).

English Translation of Chinese Office Action dated Mar. 31, 2023, received in Chinese Application No. 201880072282.2, 6 pages (Chinese Office Action filed in IDS dated May 1, 2023).

Taiwan Patent Office, Office Action received in TW Application No. 111146988, Apr. 17, 2024, 8 pages (including translation).

* cited by examiner

SUBSTRATE HANDLING APPARATUS FOR EXTREME WARPED WAFERS

CROSS-REFERENCE TO RELATED APPLICATION

The present application claims the benefit under 35 U.S.C. § 119(e) of U.S. Provisional Application Ser. No. 62/578,251, filed Oct. 27, 2017, entitled END EFFECTOR FOR HANDLING DEVICE FOR EXTREME WARPED SILICON WAFERS, naming Balajee Raghavan and Andrey Yakovlev as inventors, which is incorporated herein by reference in the entirety.

TECHNICAL FIELD

The present invention generally relates to sample inspection, and, more particularly, to a substrate handling apparatus for handling warped substrates.

BACKGROUND

Semiconductor sample inspection requires careful handling of the samples, such as silicon wafers. However, previous wafer handling methods may be unable to adequately handle wafers of various shapes and sizes. For example, previous handling approaches may be unable to handle warped wafers, such as warped 300 mm wafers. Previous wafer handling methods may include the edge-contact method, the 3× vacuum suction cup method, and the gravity method. The edge-contact handling method may be unable to handle a range of sample substrate thicknesses, resulting in unstable handling. Similarly, the 3× vacuum suction cup method may be ineffective in handling various wafer shapes, including warped wafers. Lastly, under the gravity method, handling tools may be unable to move at high speeds, resulting in low throughput. Therefore, it would be desirable to provide a system and method that cure one or more of the shortfalls of the previous approaches identified above.

SUMMARY

A substrate handling apparatus is disclosed, in accordance with one or more embodiments of the present disclosure. In one embodiment, the substrate handling apparatus includes a forked structure. In another embodiment, the forked structure includes a first support portion and a second support portion. In another embodiment, the first support portion and the second support portion are arranged to provide access to a back surface of a substrate for placement of the substrate on a support structure. In another embodiment, the substrate handling apparatus includes a first active support element and a second active support element disposed on the forked structure. In one embodiment, the first active support element and the second active support element are disposed between the first support portion and the second support portion of the forked structure. In another embodiment, the substrate handling apparatus includes a plurality of passive support elements disposed on the forked structure. In another embodiment, the first active support element and the second active support element are configured such that a center of gravity of the substrate is positioned in front of the first active support element and the second active support element.

A substrate handling apparatus is disclosed, in accordance with one or more embodiments of the present disclosure. In one embodiment, the substrate handling apparatus includes a forked structure. In one embodiment, the forked structure includes a first support portion and a second support portion. In another embodiment, the first support portion and the second support portion are arranged to provide access to a back surface of a substrate for placement of the substrate on a support structure. In another embodiment, the substrate handling apparatus includes a first active support element and a second active support element disposed on the forked structure. In another embodiment, the first active support element and the second active support element are disposed between the first support portion and the second support portion of the forked structure. In another embodiment, the substrate handling apparatus includes one or more passive support elements disposed on the forked structure. In another embodiment, the first active support element and the second active support element are configured such that a center of gravity of the substrate is positioned in front of the first suction element and the second suction element.

A system for handling a substrate is disclosed, in accordance with one or more embodiments of the present disclosure. In one embodiment, the system includes a chuck. In another embodiment, the system includes a substrate handing device. In another embodiment, the substrate handling device includes a forked structure including a first support portion and a second support portion. In another embodiment, the first support portion and the second support portion are arranged to provide access to a back surface of a substrate for placement of the substrate on the chuck. In another embodiment, the substrate handling device includes a first active support element and a second active support element disposed on the forked structure. In another embodiment, the first active support element and the second active support element are disposed between the first support portion and the second support portion of the forked structure. In another embodiment, the substrate handling device includes one or more passive support elements disposed on the forked structure. In another embodiment, the first active support element and the second active support element are configured such that a center of gravity of the substrate is positioned in front of the first active support element and the second active support element.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Referring generally to FIGS. 1A-4, systems and methods for handling substrates are described, in accordance with one or more embodiments of the present disclosure.

Embodiments of the present disclosure are directed to a substrate handling apparatus configured to handle a wide variety of substrate shapes and sizes, including warped substrates. Additional embodiments of the present disclosure are directed to a substrate handling apparatus including a forked structure, a first active support element, and a second active support element. It is noted herein that the substrate handling apparatus of the present disclosure may be able to safely and efficiently handle substrates of various shapes and sizes, thereby reducing contamination and increasing throughput.

Figure 1A:
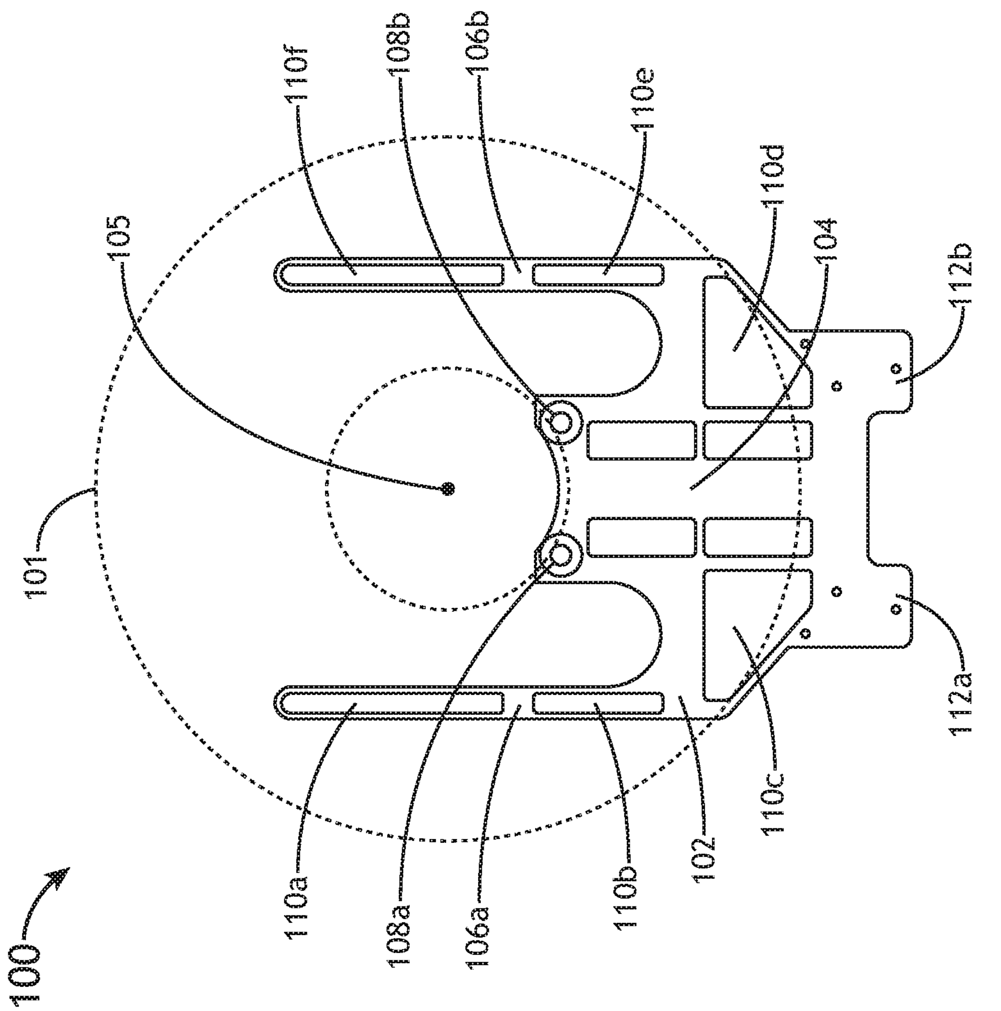
FIG. 1A illustrates a top view of a substrate handling apparatus, in accordance with one or more embodiments of the present disclosure.

FIG. 1A illustrates a top view of a substrate handling apparatus 100, in accordance with one or more embodiments of the present disclosure. In one embodiment, the substrate handling apparatus 100 includes a forked structure 102. The forked structure 102 may include, but is not limited to, a base 104, one or more support portions 106, one or more active support elements 108, one or more passive support elements 110, and one or more attachment structures 112.

In one embodiment, the substrate handling apparatus 100 is configured to handle a substrate 101. Substrate handling apparatus 100 may be configured to receive a substrate 101 on the top surface of the substrate handling apparatus 100 in order to handle and/or transport the substrate 101. In this regard, a back surface of a substrate 101 may be placed on the top surface of the substrate handling apparatus (depicted in FIG. 1A) while in operation (e.g., while the substrate handling apparatus 100 is handling and/or transporting the substrate 101). Accordingly, it is noted herein that the broken lines of substrate 101 in FIG. 1A illustrate that the view is "seeing through" the substrate 101 in order to view substrate handling apparatus 100 beneath the substrate 101.

Substrate 101 may include any substrate known in the art including, but not limited to, a wafer, a mask, a reticle, a silicon wafer, a silicon carbide wafer, a composite material wafer, and the like. For example, substrate 101 may include a semiconductor wafer. For instance, substrate 101 may include a silicon wafer. As noted previously herein, substrate handling apparatus 100 may be configured to handle substrates 101 of various sizes, shapes, and/or thicknesses. For example, substrate handling apparatus 100 may be configured to handle a substrate 101 with a diameter of 300 mm and a thickness of 200-1500 μm. In another example, substrate handling apparatus 100 may be configured to handle a substrate 101 with a warpage of 5 mm. In yet another example, substrate handling apparatus 100 may be configured to handle a randomly warped substrate 101 with an uneven, random thickness.

Forked structure 102 may include a base 104. In one embodiment, base 104 includes one or more attachment structures 112 configured to attach substrate handling apparatus 100 to a handling tool configured to move substrates 101 from one location to another including, but not limited to, a robot, an actuatable mechanical arm, or the like. For example, as depicted in FIG. 1A, substrate handling apparatus 100 may include a first attachment structure 112*a* and a second substrate attachment structure 112*b* coupled to the body 104. In this example, the first attachment structure 112*a* and the second attachment structure 112*b* may be mechanically coupled to a handling tool including, but not limited to, an articulable mechanical arm. Attachment structures 112 may include any attachment structures known in the art to mechanically couple components including, but not limited to, interlocking components, hitches, nut/bolt assemblies, pin assemblies, and the like.

In another embodiment, forked structure 102 includes one or more support portions 106. In an embodiment, the one or more support portions 106 may extend from the base 104 of the substrate handling apparatus 100. Support portions 106 may include any support structures known in the art including, but not limited to, prongs, arms, support discs, support tabs, and the like. For example, forked structure 102 may include a first support portion 106*a* and a second support portion 106*b*. As depicted in FIG. 1A, support portions 106 may resemble "arms" or "prongs." However, this is not to be regarded as a limitation on the present disclosure, unless noted otherwise herein.

In another embodiment, substrate handling apparatus 100 includes one or more active support elements 108. The one or more active support elements 108 may include any support elements configured to actively support a substrate 101 known in the art including, but not limited to, one or more suction cups, one or more vacuum elements, one or more magnets, and the like. The active support elements 108 may be disposed on the body 104 of the forked structure 102. In one embodiment, as illustrated in FIG. 1A, the one or more active support elements 108 may be disposed on the forked structure 102 between the first support portion 106*a* and the second support portion 106*b*.

The one or more active support elements 108 may be configured to couple to the back surface of the substrate 101 to provide for more stable and secure handling. For example, suction cups or other vacuum elements (active support elements 108) may utilize pressure differentials to couple the substrate handling apparatus 100 to the back surface of a substrate 101. Similarly, magnets may utilize magnetic fields to couple the substrate handling apparatus 100 to the back surface of a substrate 101.

As noted previously, the one or more active support elements 108 may include suction cups, vacuum elements, magnets, and the like. For example, as depicted in FIG. 1A, forked structure 102 of substrate handling apparatus 100 includes a first vacuum suction cup (first active support element 108*a*) and a second vacuum suction cup (active support element 108*b*).

In another embodiment, the substrate handling apparatus 100 includes one or more passive support elements 110. For example, as depicted in FIG. 1A, substrate handling apparatus 100 may include a first passive support element 110*a*, a second passive support element 110*b*, a third passive support element 110*c*, a fourth passive support element 110*d*, a fifth passive support element 110*e*, and a sixth passive support element 110*f*. One or more passive support elements 110 may be arranged on the body 104 and the one or more support portions 106 in any configuration. Therefore, the configuration depicted in FIG. 1A is provided solely for illustration, unless noted otherwise herein. By way of example, the substrate handling apparatus 100 may include a single continuous passive support element 110 which covers a portion, all, or substantially all of the top surface of the substrate handling apparatus 100.

The one or more passive support elements 110 may include any layers, coatings, support pads, or structures known in the art for contacting substrates 101 including, but not limited to, silicon coatings, silicon pads, electrostatic discharge (ESD) coatings, ESD pads, ESD mats, and the like. It is noted herein that substrates (substrate 101) may be damaged during handling and/or transportation by electrical contamination and/or arcing. In this regard, electrically insulating support pads or coatings (e.g., electrically insulating passive support elements 110) may serve to limit electrical contamination and arcing, thereby preventing and/or limiting damage to the substrate 101. In another embodiment, the one or more passive support elements 110 may be formed from any high-friction material, coating, or the like. High-friction materials may allow the one or more passive support elements 110 to prevent substrate 101 from sliding around within the substrate handling apparatus 100, thereby providing increased control and handling capabilities.

In one embodiment, the one or more active support elements 108 (e.g., first active support element 108*a* and second active support element 108*b*) are positioned within the substrate handling apparatus 100 so as to couple to the substrate 101 at positions which are relatively close to the center of the substrate 101. It is notes herein that positions proximate to the center of substrate 101 may be less susceptible to some irregularities, such as warping. As such, embodiments which allow the one or more active support elements 108 to couple to the substrate 101 at positions which are proximate to the center of substrate 101 may provide for improved handling with warped substrates.

In embodiments with a first active support element 108*a* and a second active support element 108*b*, it is noted herein that a substrate 101 will naturally "create" at least a third point of contact (e.g., passive point of contact) somewhere along the substrate handling apparatus 100 (e.g., forked structure 102, one or more support portions 106, one or more passive support elements 110, and the like). For example, as depicted in FIG. 1A, a substrate 101 placed on substrate handling apparatus 100 and coupled to the forked structure 102 via the first active support element 108*a* and the second active support element 108*b* will naturally "create" at least a third point of contact (a "passive point of contact") at some point along substrate handling apparatus 100, either due to the shape of the substrate 101 or due to the substrate 101 leaning, tilting, or the like. For instance, the substrate 101 may lean and create a passive point of contact along the first support portion 106*a* such that the substrate 101 is coupled to the substrate handling apparatus 100 at the first active support element 108*a*, the second active support element 108*b*, and the passive point of contact on first support portion 106*a*. In another example, a substrate 101 may be warped such that it creates a passive point of contact along the second support portion 106*b*. In this regard, the substrate 101 is coupled to the substrate handling apparatus 100 at the first active support element 108*a*, the second active support element 108*b*, and the passive point of contact on second support portion 106*b*.

In another embodiment, substrate handling apparatus 100 is configured to couple to a substrate 101 such that the center of gravity 105 of the substrate 101 is "in front of" the one or more active support elements 108, as illustrated in FIG. 1A. For example, the center of gravity 105 of the substrate 101 may be located in front of the first active support element 108*a* and the second active support element 108*b*, and may be located between the first support portion 106*a* and the second support portion 106*b*. By coupling to the substrate 101 such that the center of gravity 105 of the substrate 101 is in front of the one or more active support elements 108, it may be assured that the substrate 101 will lean, tilt, or otherwise form at least a third, passive point of contact at a point somewhere along the one or more support portions 106.

The natural creation of at least a third, passive point of contact may be distinguished from, and provide benefits over, previous 3× vacuum suction cup approaches described above. In a 3× vacuum suction cup approach, a substrate 101 may be coupled to a handling apparatus only at the three points which are defined by the pre-determined location of the three vacuum suction cups. Thus, in a 3× vacuum suction cup approach, the substrate handling apparatus couples to each substrate with a standard arrangement. This standard arrangement of the 3× vacuum suction cup approach may be ill-equipped to handle substrates of different sizes, shapes, and the like. Furthermore, the standard arrangement of the 3× vacuum suction cup approach may be ill-suited to handle warped substrates due to the irregular shape of the warped substrates. As such, the 3× vacuum suction cup approach may suffer from decreased handling and control abilities when handling warped substrates.

Comparatively, by naturally creating at least a third, passive point of contact, the substrate handling apparatus 100 of the present disclosure may provide for increased handling and control abilities with substrates of all shapes and sizes. Due to the fact that the substrate 101 coupled to the substrate handling apparatus 100 will naturally lean, tilt, or otherwise "create" at least a third, passive point of contact, each substrate 101 handled by the substrate handling apparatus 100 may have a unique handling arrangement (determined by the at least three points of contact), giving substrate handling apparatus 100 increased flexibility and utility over prior approaches. It is noted herein that substrate handling apparatus 100 may be able to handle substrates 101 of all shapes and sizes including, but not limited to, regular substrates, irregular substrates, warped convex substrates, warped concave substrates, warped saddle substrates (warped "potato chip" substrates), substrates with random local warp, and the like. With two points of contact via the first active support element 108*a* and the second active support element 108*b*, a substrate 101 will naturally and automatically lean or tilt to find at least a third, passive point of contact along the substrate handling apparatus 100. Thus, with substrate handling apparatus 100, a substrate 101 will automatically lay down onto at least a third point of contact no matter the shape of the substrate 101, the degree of warp, the direction of warp, the type of warp, or the like.

It is noted herein that the center of substrate 101 may be less susceptible to warping than are outer portions of the substrate 101. As such, portions of the substrate 101 near the center of the substrate 101 (e.g., center of gravity 105) may exhibit a lower warp metric (a metric indicative of the degree of warp) per unit distance as compared to outer portions of the substrate 101. Accordingly, in another embodiment, the one or more active support elements 108 may be positioned in close proximity to the center of gravity 105 of the substrate (such that the center of gravity 105 is still "in front of" the active support elements 108) in order to minimize effects of warp on the one or more active support elements 108. Similarly, the one or more active support elements 108 may be positioned in close proximity to one another in order to minimize warp between the one or more active support elements 108. For example, the first active support element 108*a* and the second active support element 108*b* may be positioned in close proximity to one another to minimize the amount of warp between the first active support element 108*a* and the second active support element 108*b*. By decreasing the amount of warp between the one or more active support elements 108, each of the one or more active support elements 108 may be able to more effectively couple to the substrate 101, leading to increased handling and control.

Figure 1B:
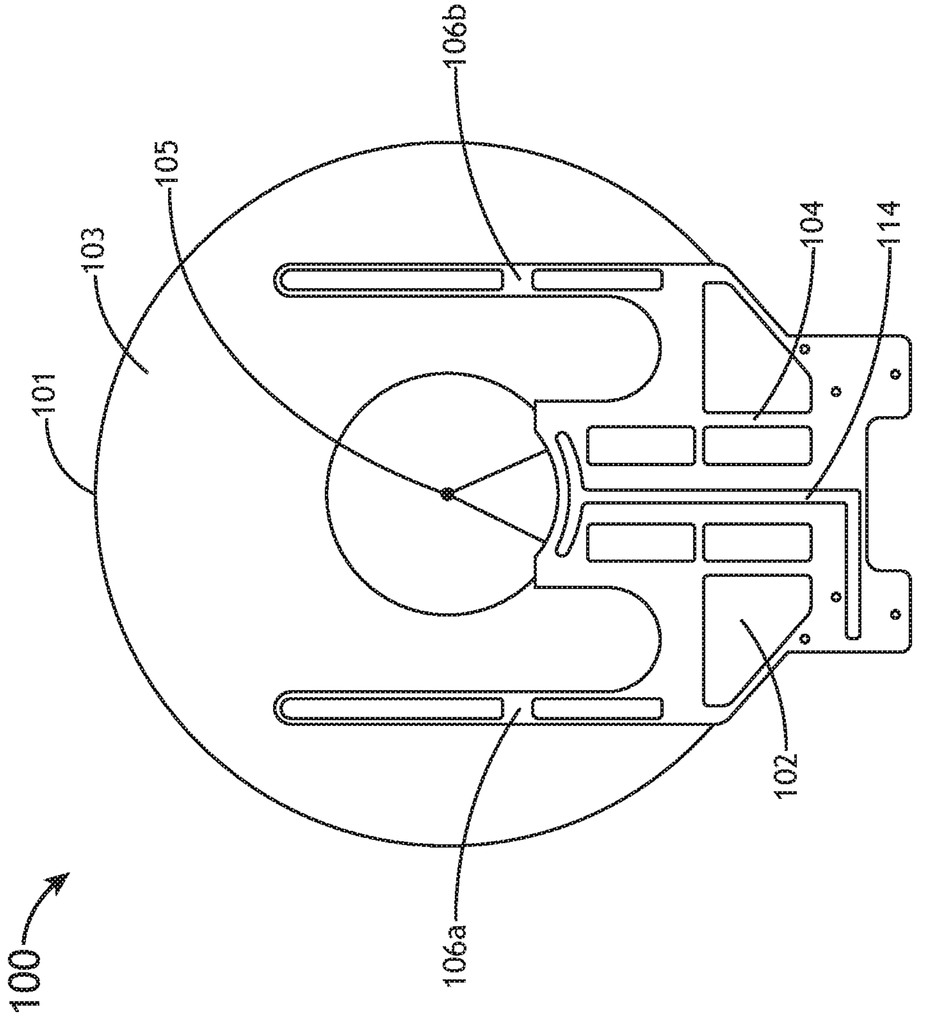
FIG. 1B illustrates a bottom view substrate handling apparatus, in accordance with one or more embodiments of the present disclosure.

FIG. 1B illustrates a bottom view of a substrate handling apparatus 100, in accordance with one or more embodiments of the present disclosure. Substrate handling apparatus 100 may include, but is not limited to, the forked structure 102, the base 104, one or more support portions 106, and one or more vacuum channels 114. In one embodiment, substrate handling apparatus 100 is configured to pick up, handle, and/or carry a substrate 101. In this regard, substrate handling apparatus 100 may be configured to couple to the back surface 103 of substrate 101, as shown in FIG. 1B.

In another embodiment, the forked structure 102 of the substrate handling apparatus 100 includes one or more vacuum channels 114. The one or more vacuum channels 114 may be configured to fluidically couple the one or more active support elements 108 (vacuum suction cups) to a vacuum source (not shown). The one or more vacuum channels 114 may include any channel known in the art including, but not limited to, one or more tubes, one or more pipes, one or more ducts, and the like. It is noted herein that the vacuum source (not shown) may constitute a component of substrate handling apparatus 100. Additionally, and/or alternatively, the vacuum source may constitute a separate or stand-alone vacuum source separate from substrate handling apparatus 100.

The one or more vacuum channels 114 may include any number or arrangement of vacuum channels known in the art, unless noted otherwise herein. For example, the one or more vacuum channels 114 may include a single, forked vacuum channel which fluidically couples the one or more active support elements 108 to the vacuum source. By way of another example, the one or more vacuum channels 114 may include multiple separate vacuum channels. For instance, where substrate handling apparatus 100 includes a first active support element 108*a* and a second active support element 108*b*, the one or more vacuum channels 114 may include two separate vacuum channels 114 such that each active support element 108 has a dedicated vacuum channel 114.

In another embodiment, the one or more vacuum channels 114 may exhibit symmetrical paths from the vacuum source to each of the one or more active support elements 108. It is noted herein that symmetrical paths of the one or more vacuum channels may cause the force generated by each of the one or more active support elements 108 to be substantially equivalent. It is noted, however, that symmetrical paths from the vacuum source is not to be regarded as a limitation of the present disclosure, unless noted otherwise herein. Additionally, and/or alternatively, the one or more vacuum channels 114 and/or the one or more active support elements 108 may be configured such that each of the one or more active support elements 108 engage and couple to the back surface 103 of the substrate 101 at substantially the same time (e.g., "uniform" coupling).

In an alternative embodiment, the one or more vacuum channels 114 and/or one or more active support elements 108 may be configured such that the one or more active support elements 108 engage and couple to the substrate 101 at different times (e.g., "non-uniform" coupling). In non-uniform coupling embodiments, the first active support element 108 coupled to the substrate 101 may serve to hold the substrate 101 in place such that subsequent active support elements 108 may effectively couple to the substrate 101. For example, the first active support element 108*a* may include a shorter vacuum channel 114, and the second active support element 108*b* may include a longer vacuum channel 114. In this example, the first active support element 108*a* may engage and couple to the substrate 101 before the second active support element 108*b*. When the first active support element 108*a* couples to the back surface 103 of substrate 101, it may momentarily pull down and hold the substrate 101 such that the second active support element 108*b* may engage and effectively couple to the back surface 103 of substrate 101.

Figure 2:
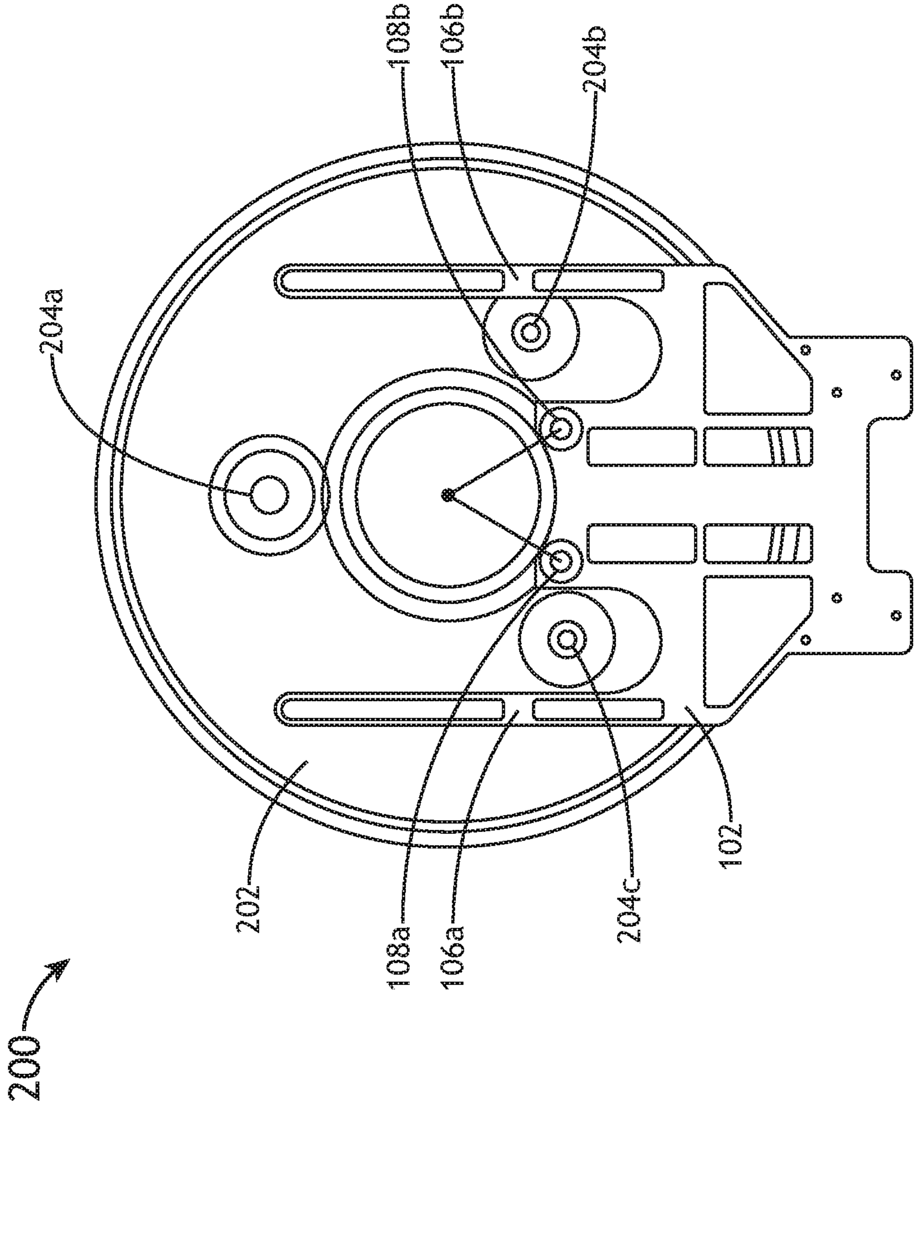
FIG. 2 illustrates a top view of a substrate handling system, in accordance with one or more embodiments of the present disclosure.

FIG. 2 illustrates a top view of a substrate handling system 200, in accordance with one or more embodiments of the present disclosure. The substrate handling system 200 may include, but is not limited to, substrate handling apparatus 100, a support structure 202, and one or more substrate contact points 204.

As depicted in FIG. 2, substrate handling apparatus 100 may be configured to handle a substrate 101 and to place the substrate 101 on one or more substrate contact points 204*a*, 104*b*, 204*c* of a support structure 202. The support structure 202 may include any substrate support structure 202 known in the art. For example, the support structure 202 may include a chuck of a process tool or characterization tool. In another example, the support structure 202 may include a support structure of a substrate transportation device (e.g., wafer transportation device). For instance, the support structure 202 may include a support structure of a front opening unified pod (FOUP). By way of another example, the support structure 202 may include a pre-aligner. The one or more substrate contact points 204 may include any structures configured to receive a substrate 101 including, but not limited to, one or more active support elements, one or more passive support elements, one or more electrically insulating structures, and the like.

Figure 3:
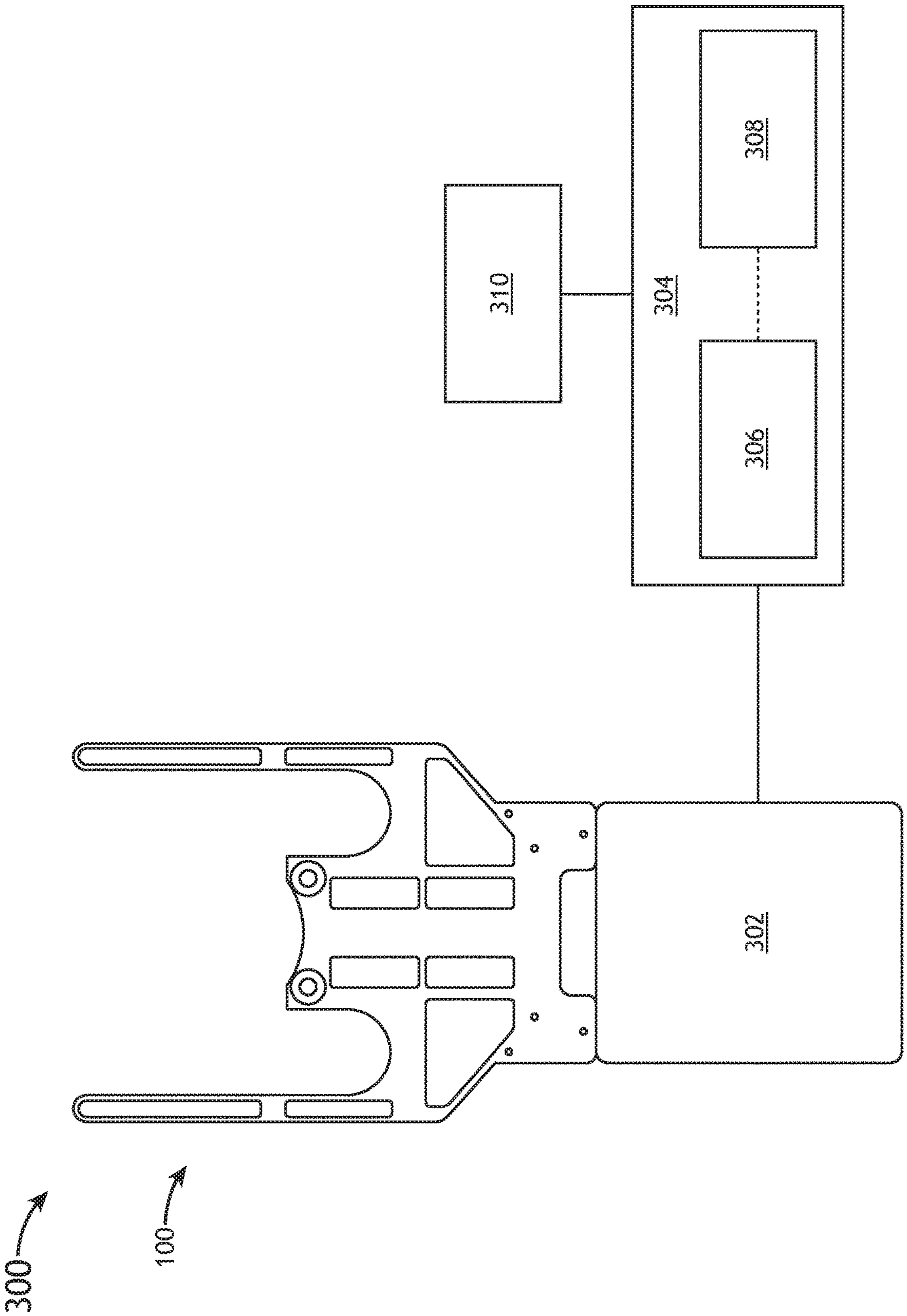
FIG. 3 illustrates a simplified schematic view of a substrate handling system, in accordance with one or more embodiments of the present disclosure.

FIG. 3 illustrates a simplified schematic view of a substrate handling system 300, in accordance with one or more embodiments of the present disclosure. The substrate handling system 300 may include, but is not limited to, substrate handling apparatus 100, a handling tool 302, a controller 304, and a user interface 310.

In one embodiment, the substrate handling apparatus 100 may be mechanically coupled to a handling tool 302. Handling tool 302 may include any handling tool known in the art including, but not limited to, a robot, an actuatable mechanical arm, and the like. In another embodiment, the substrate handling apparatus 100 and/or the handling tool 302 are communicatively coupled to a controller 304. The controller 304 may include one or more processors 306 and memory 308. In one embodiment, the one or more processors 306 of controller 304 are configured to execute a set of program instructions stored in memory 308, the program instructions configured to cause the one or more processors 306 to carry out one or more of the steps/actions of the present disclosure. For example, the one or more processors 306 may be configured to actuate the handling tool 302. By way of another example, the one or more processors 306 may be configured to engage the one or more active support elements 108 (e.g., activate vacuum source) in order to couple the substrate handling apparatus 100 to a substrate in order to pick up the substrate 101. By way of another example, the one or more processors 306 may be configured to dis-engage the one or more active support elements 108 (e.g., deactivate vacuum source) in order to de-couple the substrate handling apparatus 100 from a substrate 101 and place the substrate 101 on a support structure 202.

In another embodiment, the controller 304 is communicatively coupled to a user interface 310. The user interface 310 may include any user interface known in the art configured to display information and/or receive inputs or commands from a user. Similarly, the one or more processors 306 may be configured to receive one or more inputs/commands from the user interface 310 and cause system 300 to perform one or more actions/steps in response to the one or more inputs/commands.

In one embodiment, the one or more processors 306 may include any one or more processing elements known in the art. In this sense, the one or more processors 306 may include any microprocessor-type device configured to execute software algorithms and/or instructions. In one embodiment, the one or more processors 306 may consist of a desktop computer, mainframe computer system, workstation, image computer, parallel processor, or other computer system (e.g., networked computer) configured to execute a program configured to operate the system 300, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 306. In general, the term "processor" may be broadly defined to encompass any device having one or more processing elements, which execute program instructions from memory 308. Moreover, different subsystems of the system 300 (e.g., substrate handling apparatus 100, vacuum source, handling tool 302, controller 304) may include processor or logic elements suitable for carrying out at least a portion of the steps described throughout the present disclosure. Therefore, the above description should not be interpreted as a limitation on the present disclosure but merely an illustration.

The memory 308 may include any storage medium known in the art suitable for storing program instructions executable by the associated one or more processors 306. For example, the memory 308 may include a non-transitory memory medium. For instance, the memory 308 may include, but is not limited to, a read-only memory (ROM), a random access memory (RAM), a magnetic or optical memory device (e.g., disk), a magnetic tape, a solid state drive, and the like. It is further noted that memory 308 may be housed in a common controller housing with the one or more processors 306. In an alternative embodiment, the memory 308 may be located remotely with respect to the physical location of the processors 306 and controller 304. In another embodiment, the memory 308 maintains program instructions for causing the one or more processors 306 to carry out the various steps described through the present disclosure.

In one embodiment, the user interface 310 may include, but is not limited to, one or more desktops, tablets, smartphones, smart watches, or the like. In another embodiment, the user interface 310 includes a display used to display data of the system 300 to a user. The display of the user interface 310 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 310 is suitable for implementation in the present disclosure. In another embodiment, a user may input selections and/or instructions responsive to data displayed to the user via the user interface 310.

Figure 4:
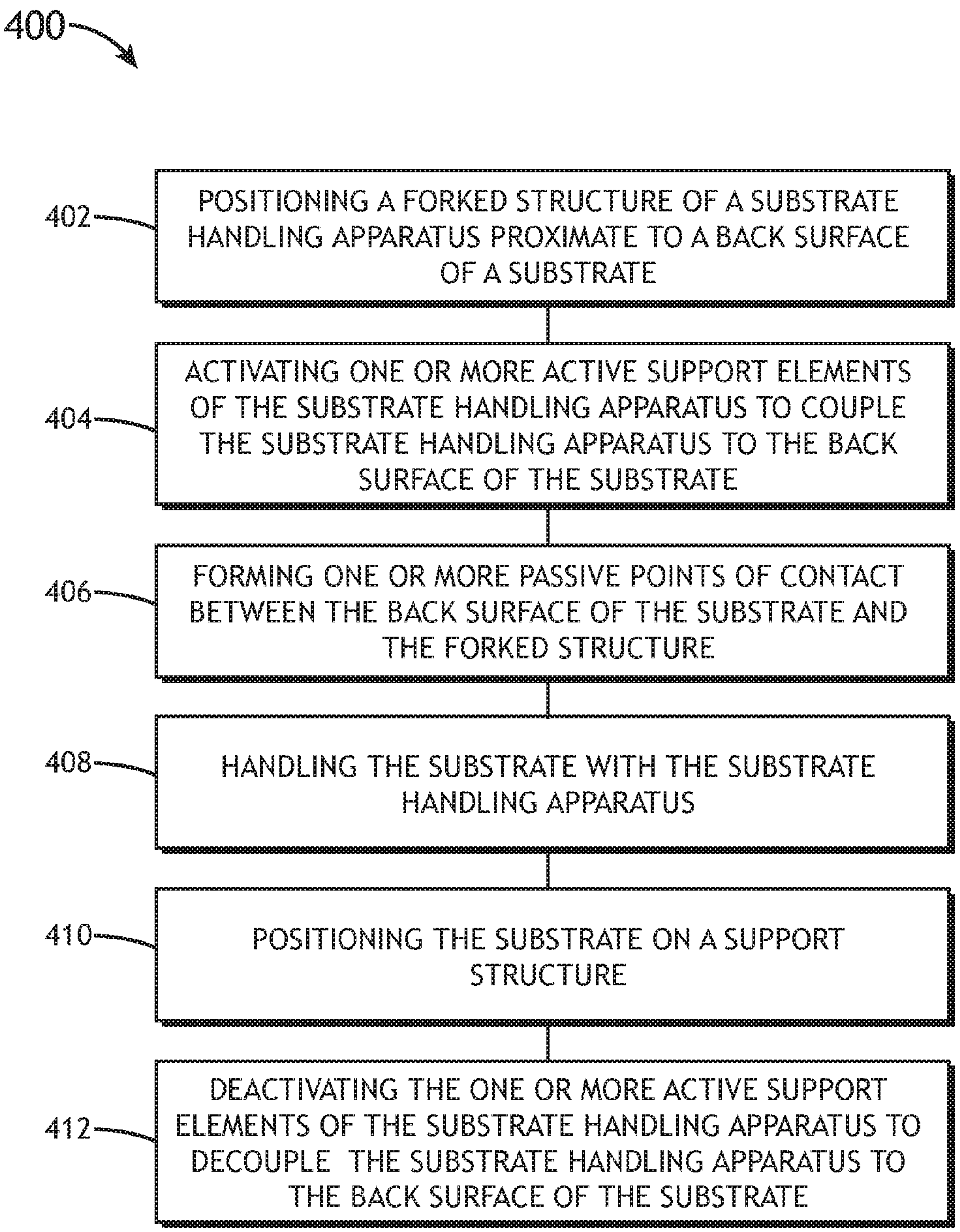
FIG. 4 illustrates a flowchart of a method of handling a substrate, in accordance with one or more embodiments of the present disclosure.

FIG. 4 illustrates a flowchart of a method 400 of handling a substrate, in accordance with one or more embodiments of the present disclosure. It is noted herein that the steps of method 400 may be implemented all or in part by substrate handling apparatus 100 and/or systems 200, 300. It is further recognized, however, that the method 400 is not limited to the substrate handling apparatus 100 and/or systems 200, 300, in that additional or alternative system-level embodiments may carry out all or part of the steps of method 400.

In a step 402, a forked structure of a substrate handling apparatus is positioned proximate to a back surface of a substrate. For example, substrate handling apparatus 100 with forked structure 102 may be positioned underneath a substrate 101, proximate to the back surface 103 of the substrate.

In a step 404, one or more active support elements of the substrate handling apparatus are activated to couple the substrate handling apparatus to the back surface of the substrate. In one embodiment, the one or more active support elements 108 include one or more vacuum suction cups. For example, in the step 404, a vacuum source may be activated in order to activate/engage the one or more vacuum suction cups (e.g., one or more active support elements 108). Upon activation of the vacuum source, the one or more active support elements 108 may couple to the back surface 103 of the substrate. As noted previously herein, the one or more active support elements 108 may be configured to couple to the back surface 103 of the substrate 101 at substantially the same time (e.g., a uniform coupling configuration) or at different times (e.g., non-uniform coupling configuration).

In a step 406, one or more passive points of contact are formed between the back surface of the substrate and the forked structure. For example, when a substrate is placed on the substrate handling apparatus 100 and coupled to the first active support element **108*a* and the second active support element 108*b*, the substrate may naturally/automatically lean or tilt to form at least a third, passive point of contact between the back surface 103 of the substrate 101 and the forked structure 102. As noted previously herein, the creation of one or more passive points of contact may allow the substrate handling apparatus 100 of the present disclosure to handle substrates 101** with varying shapes and irregularities including, but not limited to, regular substrates, irregular substrates, warped convex substrates, warped concave substrates, warped saddle substrates, substrates with random local warp, and the like.

In a step 408, the substrate is handled with the substrate handling apparatus. For example, the substrate handling apparatus 100 may be coupled to an actuatable mechanical arm (e.g., handling tool 302) which is configured to transport the substrate from one location to another.

In a step 410, the substrate is positioned on a support structure. The support structure 202 may include any substrate support structure 202 known in the art including, but not limited to, a chuck of a process tool or characterization tool, a substrate transportation device, a wafer transportation device, a support structure of a front opening unified pod (FOUP), and the like.

In a step 412, the one or more active support elements of the substrate handling apparatus are deactivated to decouple the substrate handling apparatus from the back surface of the substrate. For example, the vacuum source may be deactivated, which may cause the one or more vacuum suction cups (e.g., one or more active support elements) to deactivate/disengage and decouple form the back surface 103 of the substrate 101. After the one or more active support elements 108 are decoupled from the substrate, the substrate handling apparatus 100 may be moved away from the back surface 103 of the substrate 101. For example, after placing the substrate on a support structure 202 (e.g., a chuck), the one or more active support elements 108 may decouple from the substrate 101, and a handling tool 302 (e.g., an actuatable mechanical arm) may pull the forked structure out from beneath the substrate 101.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A substrate handling apparatus comprising:

a forked structure including a first support portion and a second support portion, wherein the first support portion and the second support portion are arranged to provide access to a back surface of a substrate for placement of the substrate on a support structure, wherein the forked structure includes a first access opening and a second access opening each having a side open to an exterior of the forked structure and each being dimensioned and positioned to permit unobstructed passage of at least one support pin of the support structure through the forked structure to the back surface of the substrate to provide a substrate carried on the forked structure mechanical contact to at least three substrate contact points of the support structure, wherein the first access opening, the second access opening, the first support portion, and the second support portion form a contiguous open region extending continuously between the first and second support portions and between the first and second access openings, such that at least three support pins of the support structure can simultaneously contact the back surface of the substrate through the contiguous open region without interference from the forked structure, wherein the first access opening and the second access opening are each open on a side to connect a space between the first support portion and the second support portion with the first access opening and the second access opening, wherein the forked structure includes a curved region positioned between the first access opening and the second access opening, wherein the first access opening is formed between the curved region and the first support portion, and wherein the second access opening is formed between the curved region and the second support portion;

wherein the curved region is disposed along an arc of a circle with its center being the center of gravity of the substrate to be held on the forked structure; and a first active support element and a second active support element disposed on the forked structure, the first active support element and the second active support element disposed on the curved region of the forked structure and positioned between the first access opening and the second access opening of the forked structure, the first active support element configured to establish a first, active point of contact on the substrate and the second active support element configured to establish a second, active point of contact on the substrate, wherein the first active support element comprises a first suction element and the second active support element comprises a second suction element, wherein the first suction element and the second suction element are fluidically coupled to a vacuum through a vacuum path of the forked structure; and a plurality of passive support elements disposed on the forked structure, wherein a first passive support element runs along a length of the first support portion and a second passive support element runs along a length of the second support portion, wherein the first access opening is located between a first pair of passive support elements and the second access opening is located between a second pair of passive support elements, wherein each of the first access opening and the second access opening is located between a respective pair of passive support elements disposed on the corresponding support portion, such that the access openings are flanked by passive support elements and the contiguous open region is bounded by said passive support elements.

2. The apparatus of claim 1, wherein the plurality of passive support elements comprise a plurality of support pads.

3. The apparatus of claim 1, wherein at least some of the plurality of support pads are textured.

4. The apparatus of claim 1, wherein at least some of the plurality of support pads are electrically insulating.

5. The apparatus of claim 1, wherein the plurality of passive support elements comprise:

one or more first support pads disposed on the first support portion of the forked structure; and one or more second support pads disposed on the second support portion of the forked structure.

6. The apparatus of claim 5, wherein the plurality of passive support elements further comprise:

one or more additional support pads disposed on an additional support portion of the forked structure, wherein the additional support section forms a base of the forked structure.

7. The apparatus of claim 1, wherein the support structure comprises a chuck of at least one of a process tool or characterization tool.

8. The apparatus of claim 1, wherein the support structure comprises a support structure of a wafer transportation device.

9. The apparatus of claim 8, wherein the wafer transportation device comprises a front opening unified pod (FOUP).

10. The apparatus of claim 1, wherein forked structure is mechanically coupled to an actuatable mechanical arm.

11. The apparatus of claim 1, wherein substrate comprises a wafer.

12. The apparatus of claim 11, wherein wafer has at least one of a convex shape, a concave shape, or a saddle shape.

13. The apparatus of claim 11, wherein wafer contains random local warp.

14. A substrate handling apparatus comprising:

a forked structure including a first support portion and a second support portion, wherein the first support portion and the second support portion are arranged to provide access to a back surface of a substrate for placement of the substrate on a support structure, wherein the forked structure includes a first access opening and a second access opening each having a side open to an exterior of the forked structure and each being dimensioned and positioned to permit unobstructed passage of at least one support pin of the support structure through the forked structure to the back surface of the substrate to provide a substrate carried on the forked structure mechanical contact to at least three substrate contact points of the support structure, wherein the first access opening, the second access opening, the first support portion, and the second support portion form a contiguous open region extending continuously between the first and second support portions and between the first and second access openings, such that at least three support pins of the support structure can simultaneously contact the back surface of the substrate through the contiguous open region without interference from the forked structure, wherein the first access opening and the second access opening are each open on a side to connect a space between the first support portion and the second support portion with the first access opening and the second access opening, wherein the forked structure includes a curved region positioned between the first access opening and the second access opening, wherein the first access opening is formed between the curved region and the first support portion, and wherein the second access opening is formed between the curved region and the second support portion;

wherein the curved region is disposed along an arc of a circle with its center being the center of gravity of the substrate to be held on the forked structure; and a first active support element and a second active support element disposed on the forked structure, the first active support element and the second active support element disposed on the curved region of the forked structure and positioned between the first access opening and the second access opening of the forked structure, the first active support element configured to establish a first, active point of contact on the substrate and the second active support element configured to establish a second, active point of contact on the substrate, wherein the first active support element comprises a first suction element and the second active support element comprises a second suction element, wherein the first suction element and the second suction element are fluidically coupled to a vacuum through a vacuum path of the forked structure; and one or more passive support elements disposed on the forked structure, wherein at least one passive support element runs along a length of at least one of the first support portion or the second support portion, wherein the first access opening is located between a first pair of passive support elements and the second access opening is located between a second pair of passive support elements, wherein each of the first access opening and the second access opening is located between a respective pair of passive support elements disposed on the corresponding support portion, such that the access openings are flanked by passive support elements and the contiguous open region is bounded by said passive support elements.

15. A system comprising:

a chuck; and a substrate handing device, wherein the substrate handling device comprises:

a forked structure including a first support portion and a second support portion, wherein the first support portion and the second support portion are arranged to provide access to a back surface of a substrate for placement of the substrate on the chuck, wherein the forked structure includes a first access opening and a second access opening each having a side open to an exterior of the forked structure and each being dimensioned and positioned to permit unobstructed passage of at least one support pin of the support structure through the forked structure to the back surface of the substrate to provide a substrate carried on the forked structure mechanical contact to at least three substrate contact points of the chuck, wherein the first access opening, the second access opening, the first support portion, and the second support portion form a contiguous open region extending continuously between the first and second support portions and between the first and second access openings, such that at least three support pins of the support structure can simultaneously contact the back surface of the substrate through the contiguous open region without interference from the forked structure, wherein the first access opening and the second access opening are each open on a side to connect a space between the first support portion and the second support portion with the first access opening and the second access opening, wherein the forked structure includes a curved region positioned between the first access opening and the second access opening, wherein the first access opening is formed between the curved region and the first support portion, and wherein the second access opening is formed between the curved region and the second support portion;

wherein the curved region is disposed along an arc of a circle with its center being the center of gravity of the substrate to be held on the forked structure; and a first active support element and a second active support element disposed on the forked structure, the first active support element and the second active support element disposed on the curved region of the forked structure and positioned between the first access opening and the second access opening of the forked structure, the first active support element configured to establish a first, active point of contact on the substrate and the second active support element configured to establish a second, active point of contact on the substrate, wherein the first active support element comprises a first suction element and the second active support element comprises a second suction element, wherein the first suction element and the second suction element are fluidically coupled to a vacuum through a vacuum path of the forked structure; and one or more passive support elements disposed on the forked structure, wherein at least one passive support element runs along a length of at least one of the first support portion or the second support portion, wherein the first access opening is located between a first pair of passive support elements and the second access opening is located between a second pair of passive support elements, wherein each of the first access opening and the second access opening is located between a respective pair of passive support elements disposed on the corresponding support portion, such that the access openings are flanked by passive support elements and the contiguous open region is bounded by said passive support elements.

16. The system of claim 15, wherein the plurality of passive support elements comprise a plurality of support pads.

17. The system of claim 16, wherein at least some of the plurality of support pads are textured.

18. The system of claim 16, wherein at least some of the plurality of support pads are electrically insulating.

19. The system of claim 15, wherein the plurality of passive support elements comprise:

one or more first support pads disposed on the first support portion of the forked structure; and one or more second support pads disposed on the second support portion of the forked structure.

20. The system of claim 19, wherein the plurality of passive support elements further comprise:

one or more additional support pads disposed on an additional support portion of the forked structure, wherein the additional support section forms the base of the forked structure.

* * * * *